US010649344B2

(12) United States Patent
Roobol et al.

(10) Patent No.: US 10,649,344 B2
(45) Date of Patent: May 12, 2020

(54) ILLUMINATION SOURCE FOR AN INSPECTION APPARATUS, INSPECTION APPARATUS AND INSPECTION METHOD

(71) Applicant: ASML Netherlands B.V., Veldhoven (NL)

(72) Inventors: Sander Bas Roobol, Veldhoven (NL); Simon Gijsbert Josephus Mathijssen, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 4 days.

(21) Appl. No.: 15/788,258

(22) Filed: Oct. 19, 2017

(65) Prior Publication Data
US 2018/0136568 A1 May 17, 2018

(30) Foreign Application Priority Data
Nov. 11, 2016 (EP) .................................. 16198346

(51) Int. Cl.
*G03F 7/20* (2006.01)
*G01N 21/956* (2006.01)
(Continued)

(52) U.S. Cl.
CPC ......... *G03F 7/70591* (2013.01); *G01N 21/47* (2013.01); *G01N 21/8806* (2013.01);
(Continued)

(58) Field of Classification Search
CPC ............. G03F 7/70591; G03F 7/70025; G03F 7/70625; H01S 3/0092; G01N 2201/0638;
(Continued)

(56) References Cited

U.S. PATENT DOCUMENTS 9,158,176 B2 * 10/2015 Chang .................... H01J 35/24
9,207,408 B1 * 12/2015 Di Teodoro ............ C03B 37/10
(Continued)

FOREIGN PATENT DOCUMENTS

JP 2012-243852 A 12/2012
KR 101344151 B1 12/2013
(Continued)

OTHER PUBLICATIONS

Ramirez et al., "Coherent beam combining with an ultrafast multicore Yb-doped fiber amplifier", *Optics Express*, Feb. 23, 2015, pp. 5406-5416, vol. 23, issue 5, The Optical Society, Washington, DC.
(Continued)

*Primary Examiner* — David P Porta
*Assistant Examiner* — Gisselle M Gutierrez
(74) *Attorney, Agent, or Firm* — Sterne, Kessler, Goldstein & Fox P.L.L.C.

(57) ABSTRACT

Disclosed is an illumination source apparatus comprising a high harmonic generation medium, a pump radiation source and a spatial filter. The pump radiation source emits a beam of pump radiation having a profile comprising no pump radiation in a central region of the beam and excites the high harmonic generation medium so as to generate high harmonic radiation. The pump radiation and the generated high harmonic radiation are spatially separated beyond the focal plane of the beam of pump radiation. The spatial filter is located beyond a focal plane of the beam of pump radiation, and blocks the pump radiation. Also disclosed is a method of generating high harmonic measurement radiation optimized for filtration of pump radiation therefrom.

20 Claims, 6 Drawing Sheets

(51) Int. Cl.
    *H01S 3/00* (2006.01)
    *G01N 21/47* (2006.01)
    *G01N 21/88* (2006.01)
    *G02F 1/35* (2006.01)
    *H05G 2/00* (2006.01)
    *G02B 5/10* (2006.01)

(52) U.S. Cl.
    CPC ........... *G01N 21/956* (2013.01); *G02F 1/353* (2013.01); *G03F 7/70025* (2013.01); *G03F 7/70625* (2013.01); *H01S 3/0092* (2013.01); *H05G 2/008* (2013.01); *G01N 2201/0631* (2013.01); *G01N 2201/0638* (2013.01); *G01N 2201/0686* (2013.01); *G01N 2201/06146* (2013.01); *G02B 5/10* (2013.01); *G02F 2001/354* (2013.01)

(58) Field of Classification Search
    CPC . G01N 2201/06146; G01N 2201/0686; G01N 2201/0631; G01N 21/956; G01N 21/8806; G01N 21/47; G02F 2001/354; G02F 1/353; H05G 2/008; G02B 5/10
    USPC .......................................................... 250/372
    See application file for complete search history.

(56) References Cited

U.S. PATENT DOCUMENTS

| | | |
|---|---|---|
| 9,293,884 B2 | 3/2016 | Fermann et al. |
| 2006/0066855 A1 | 3/2006 | Boef et al. |
| 2007/0091948 A1* | 4/2007 | Di Teodoro ....... G02B 6/02347 372/39 |
| 2007/0104431 A1* | 5/2007 | Di Teodoro ....... G02B 6/02347 385/123 |
| 2011/0102753 A1 | 5/2011 | Van De Kerkhof et al. |
| 2011/0140009 A1* | 6/2011 | Kaertner ................. H05G 2/00 250/504 R |
| 2012/0044470 A1 | 2/2012 | Smilde et al. |
| 2014/0139903 A1* | 5/2014 | Goodno ................ H01S 3/1305 359/279 |
| 2015/0198860 A1* | 7/2015 | Chang ..................... H01J 35/24 250/504 R |
| 2016/0282282 A1 | 9/2016 | Quintanilha et al. |
| 2017/0221194 A1* | 8/2017 | Ebstein ................ G06T 7/0004 |
| 2017/0315456 A1* | 11/2017 | Lin ......................... G01B 11/24 |
| 2018/0011029 A1 | 1/2018 | Tinnemans et al. |
| 2018/0239160 A1* | 8/2018 | Roobol ............... G03F 7/70158 |
| 2018/0267411 A1* | 9/2018 | Srivastava ........... G03F 7/7065 |

FOREIGN PATENT DOCUMENTS

| | | |
|---|---|---|
| KR | 101347479 B1 | 1/2014 |
| WO | WO 2018/007108 | 1/2018 |

OTHER PUBLICATIONS

Hanna et al., "Coherent combination of ultrafast fiber amplifiers", *Journal of Physics B: Atomic, Molecular and Optical Physics*, Feb. 22, 2016, vol. 49, No. 6, IOP Science, Philadelphia.

Peatross et al., "High-order harmonic generation with an annular laser beam", *Optics Letters*, Jul. 1, 1994, pp. 942-944, vol. 19, No. 13, The Optical Society, Washington, DC.

Haedrich et al., "Single-pass high harmonic generation at high repetition rate and photon flux", *Journal of Physics B: Atomic, Molecular and Optical Physics*, Aug. 16, 2016, vol. 49, No. 17, IOP Science, Philadelphia.

International Search Report and Written Opinion of the International Searching Authority directed to related International Patent Application No. PCT/EP2017/076064, dated Dec. 22, 2017; 15 pages.

International Preliminary Report on Patentability and Written Opinion of the International Searching Authority directed to related International Patent Application No. PCT/EP2017/076064, dated May 14, 2019; 8 pages.

* cited by examiner

ILLUMINATION SOURCE FOR AN INSPECTION APPARATUS, INSPECTION APPARATUS AND INSPECTION METHOD

FIELD

The present invention relates to an inspection apparatus and a method for performing a measurement. In particular, it relates to an illumination source for an inspection apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Multiple layers, each having a particular pattern and material composition, are applied to define functional devices and interconnections of the finished product.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures whose properties are actually of interest. Such product features may be defined using deep ultraviolet (DUV) or extreme ultraviolet (EUV) radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray" wavelength spectrum), it is possible to resolve smaller structures, to increase sensitivity to structural variations of the structures and/or penetrate further into the product structures. One such method of generating suitably high frequency radiation is by using a high harmonic generation (HHG) radiation source. Such a HHG radiation source uses laser radiation (e.g., infra-red radiation) to excite a HHG generating medium, thereby generating high harmonics comprising high frequency radiation.

It is important, when using the HHG radiation for measuring in an inspection apparatus, that the laser radiation is removed. This laser radiation, being IR radiation, can heat up and distort the beam delivery or projection system optics, resulting in measurement errors and inaccuracies. Current techniques for filtering IR radiation from the HHG radiation may comprise using an ultra-thin metallic filter membrane. However, as laser powers increase, these ultra-thin metallic filter membrane become unable to handle the laser radiation without damage.

SUMMARY

It would be desirable to improve filtering of pump laser radiation from the output of a high harmonic generation source.

According to a first aspect of the present invention, there is provided an illumination source apparatus, comprising: a high harmonic generation medium; a pump radiation source operable to emit a beam of pump radiation having a profile comprising no pump radiation in a central region of the beam, for exciting the high harmonic generation medium so as to generate high harmonic radiation; and a spatial filter located beyond a focal plane of said beam of pump radiation, operable to block said pump radiation; wherein said pump radiation and the generated high harmonic radiation are spatially separated beyond the focal plane of said beam of pump radiation.

According to a second aspect of the present invention, there is provided a method of generating high harmonic measurement radiation optimized for filtration of pump radiation therefrom, a beam of said pump radiation being used to generate the high harmonic measurement radiation, wherein said high harmonic measurement radiation and said pump radiation is separated spatially beyond a focal plane of said beam of pump radiation; said method comprising: coherently combining a plurality of sub-beams of pump radiation using a tiled aperture geometry wherein a central region of the tiled aperture geometry is devoid of said sub-beams.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
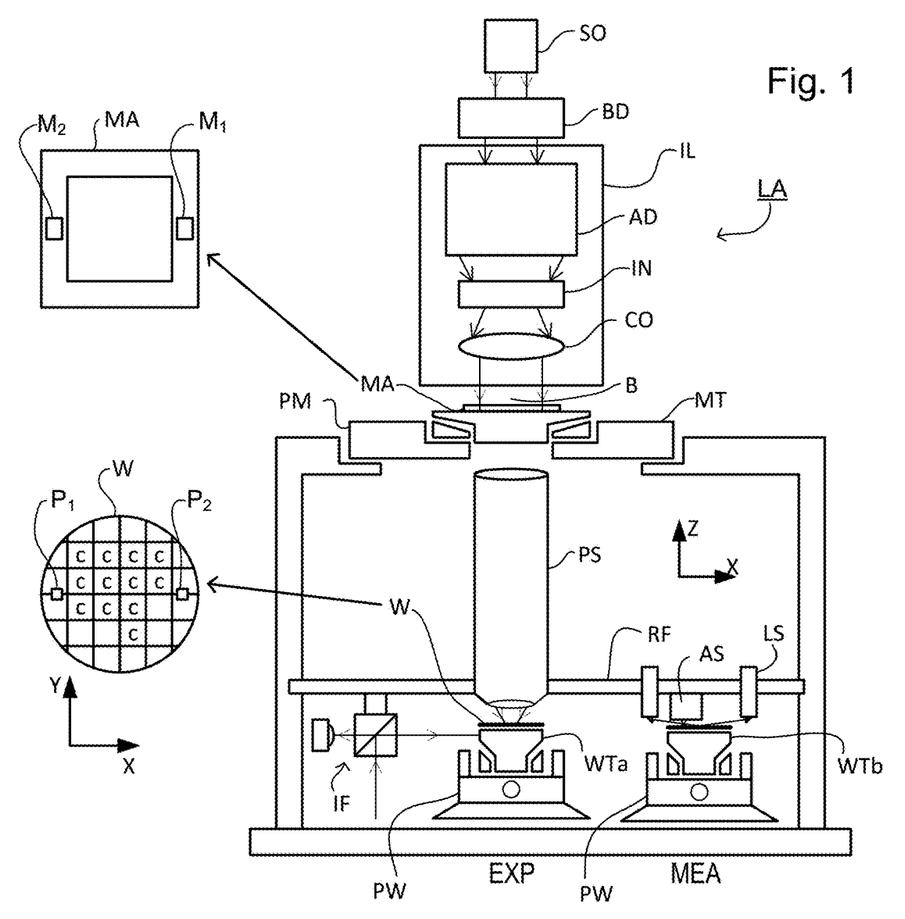
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV or EUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
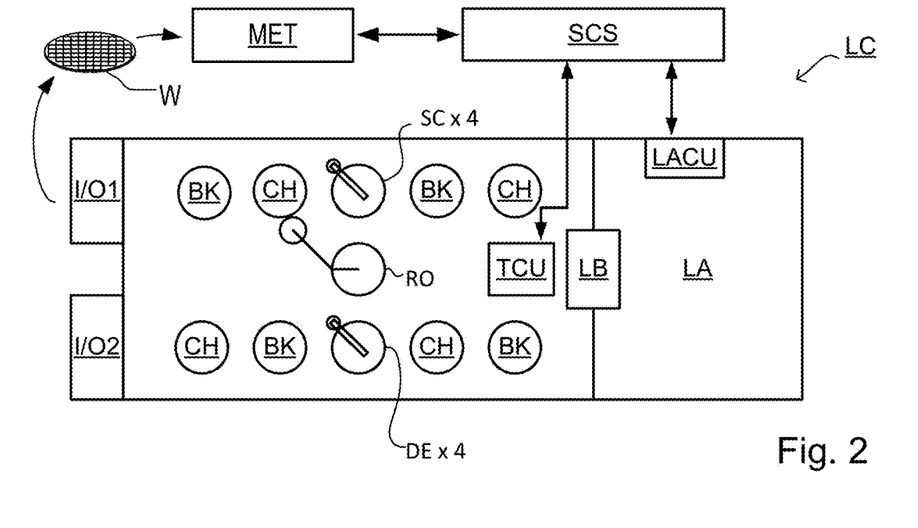
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

The substrates processed by the track are then transferred to other processing tools for etching and other chemical or physical treatments within the device manufacturing process. In some instances, metrology may be performed on substrates after such etching or chemical/physical treatment steps.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these subsystems processing units, with operators and with other apparatuses involved in the lithographic manufacturing process.

Figure 3A:
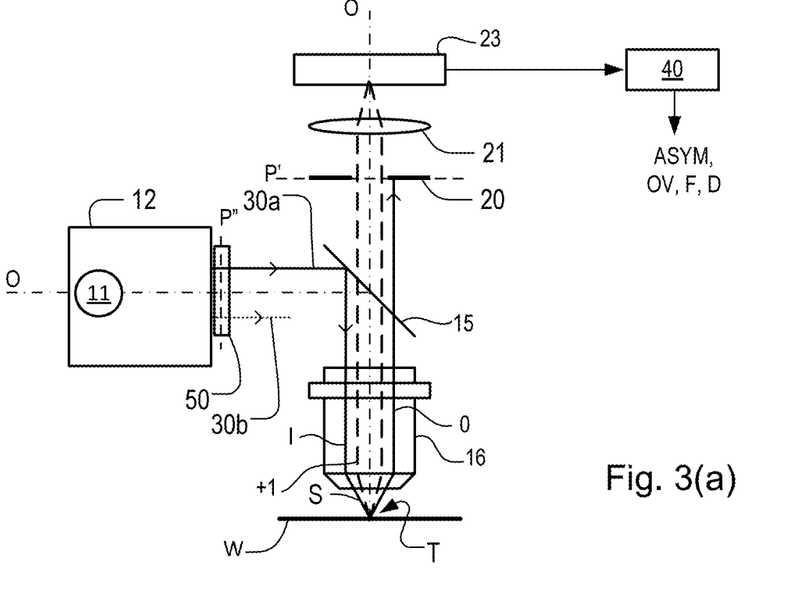
FIGS. 3(a)-3(b) illustrate schematically an inspection apparatus according to an embodiment of the invention adapted to perform a known dark-field imaging inspection methods.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-field-imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 (in this disclosure a HHG radiation source) is conditioned by an illumination system 12. For example, illumination system 12 may include a collimating lens system, a color filter, a polarizer and an aperture device. The conditioned radiation follows an illumination path, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired. The multi-purpose scatterometer may have two or more measurement branches. Additionally, further optical systems and branches will be included in a practical apparatus, for example to collect reference radiation for intensity normalization, for coarse imaging of capture targets, for focusing and so forth. Details of these can be found in the prior publications mentioned above. For the purposes of the present disclosure, only the measurement branch of interest for the dark-filed imaging metrology is illustrated and described in detail.

In the collection path for dark-field imaging, imaging optical system 21 forms an image of the target on the substrate W on sensor 23 (e.g. a CCD or CMOS sensor). An aperture stop 20 is provided in a plane P' in the collection path. Plane P' is a plane conjugate to a pupil plane P''' of objective lens 16. Aperture stop 20 may also be called a pupil stop. Aperture stop 20 can take different forms, just as the illumination aperture can take different forms. The aperture stop 20, in combination with the effective aperture of lens 16, determines what portion of the scattered radiation is used to produce the image on sensor 23. Typically, aperture stop 20 functions to block the zeroth order diffracted beam so that the image of the target formed on sensor 23 is formed only from the first order beam(s). In an example where both first order beams are combined to form an image, this would be the so-called dark field image, equivalent to dark-field microscopy. In the present application, however, only one of the first orders is imaged at a time, as explained below. The images captured by sensor 23 are output to image processor and controller 40, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the particular, illumination system 12 can be adjusted to implement different illumination profiles. Because plane P''' is conjugate with pupil plane P of objective lens 16 and the plane of the detector 19, an illumination profile in plane P''' defines the angular distribution of light incident on substrate W in spot S. To implement different illumination profiles, an aperture device can be provided in the illumination path. The aperture device may comprise different apertures mounted on a movable slide or wheel. It may alternatively comprise a programmable spatial light modulator. As a further alternative, optical fibers may be disposed at different location in the plane P''' and used selectively to deliver light or not deliver light at their respective locations. These variants are all discussed and exemplified in the documents cited above.

In a first example illumination mode, rays 30a are provided so that the angle of incidence is as shown at 'I' and the path of the zero order ray reflected by target T is labeled '0' (not to be confused with optical axis 'O'). In a second illumination mode, rays 30b can be provided, in which case the angles of incidence and reflection will be swapped. Both of these illumination modes will be recognized as off-axis illumination modes. Many different illumination modes can be implemented for different purposes.

Figure 3B:
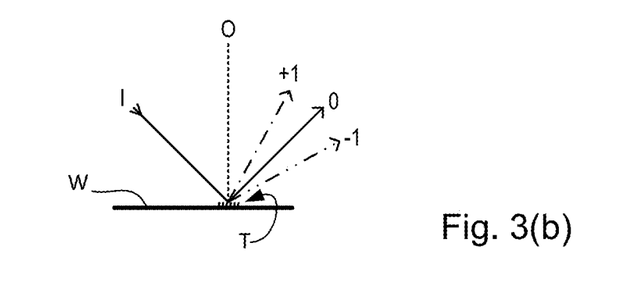

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Referring also to FIG. 3(a), under the first illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 20 blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 20 could be used to pass substantially only one first order of diffracted light to the sensor. In a further example, prisms are used in place of aperture stop 20 which have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

The above techniques are typically performed using radiation with a visible wavelength. As such, the scatterometry targets have a pitch that is larger than that of the product structures on the substrate. As an example, a scatterometry target may have a target grating pitch measured in microns (μm), whereas product structures on the same substrate may have a pitch measured in nanometers (nm).

This difference in pitch induces an offset between the measured overlay and the actual overlay on the product structures. The offset is at least partly due to optical projection distortions in the lithographic apparatus and/or different processing in other steps of the manufacturing process. Presently, the offset comprises a significant contribution to the overall measured overlay. Reducing or eliminating it will therefore improve overall overlay performance.

Metrology tools may be developed which use sources that emit radiation in "soft X-ray" or EUV range, for example having wavelengths between 2 nm and 50 nm. Examples of such sources include Discharge Produced Plasma sources, Laser Produced Plasma Sources or High-order Harmonic Generation (HHG) sources. HHG sources are known to be able to provide large flux of collimated photons (high luminance) in the emitted light.

HHG sources used in metrology applications are illustrated and further described in the European patent applications EP152020301, EP16168237, EP16167512, which are hereby incorporated in their entirety by reference. In metrology applications, such HHG sources may be used (for example) in normal incidence, very close to normal incidence (e.g., within 10 degrees from normal), at a grazing incidence (e.g., within 20 degrees from surface), at an arbitrary angle or at multiple angles (to obtain more measurement information in a single capture).

Figure 4:
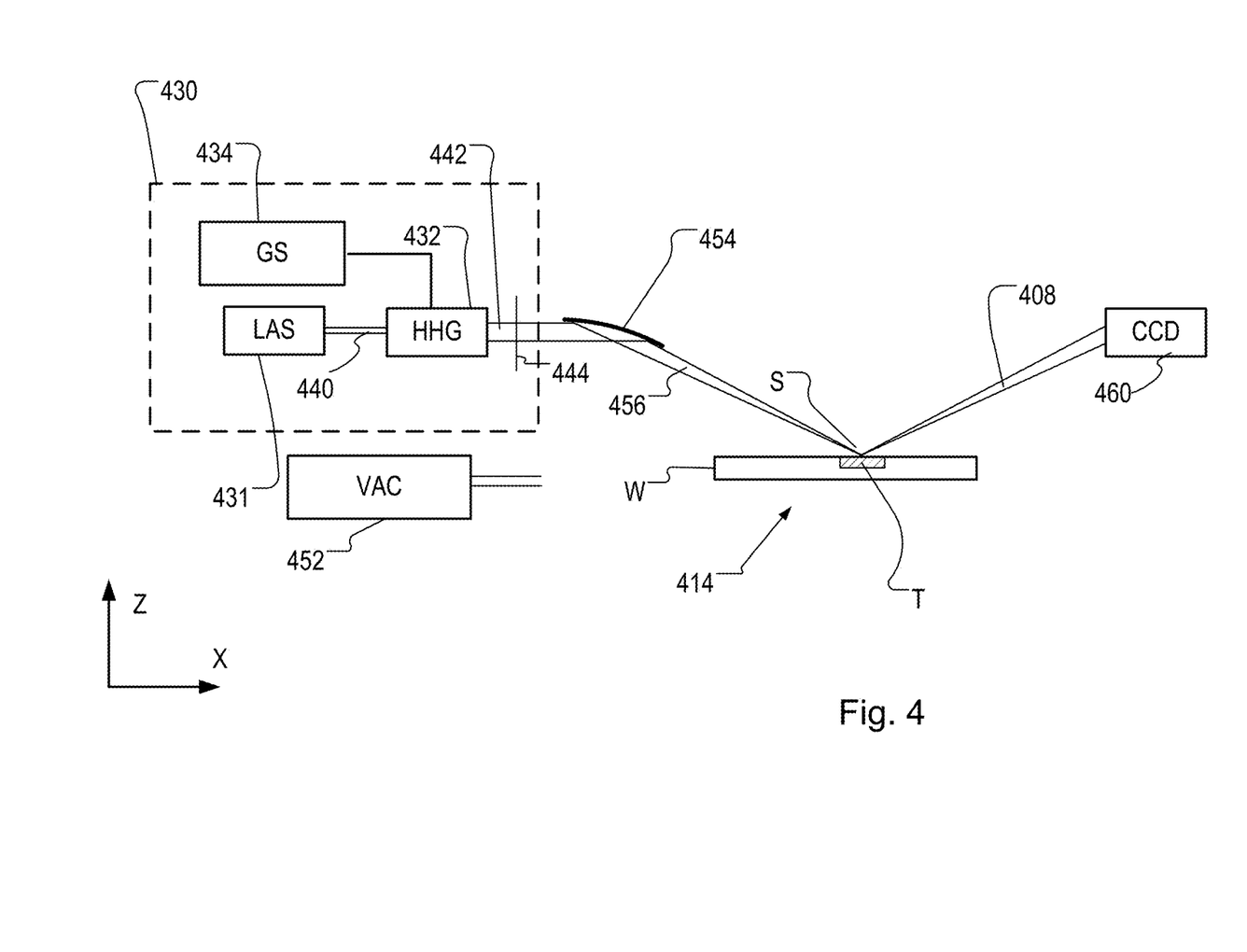
FIG. 4 schematically illustrates a metrology apparatus using a HHG source adaptable according to an embodiment of the invention.

FIG. 4 illustrates an metrology arrangement showing the radiation source 430 in more detail. Radiation source 430 is an HHG source for generating EUV radiation based on high harmonic generation (HHG) techniques. Main components of the radiation source 430 are a pump laser 431 and an HHG medium, such as a HHG gas cell 432 (a HHG solid surface medium may also be used). A gas supply 434 supplies suitable gas to the gas cell, where it is optionally ionized by an electric source (not shown). The pump laser 431 may be for example a fiber-based laser with an optical amplifier, producing pulses of infrared radiation lasting less than 1 ns (1 nanosecond) per pulse, with a pulse repetition rate up to several megahertz, as required. The wavelength may be for example in the region of 1 μm (1 micron). The laser pulses are delivered as a pump radiation beam 440 to the HHG gas cell 432, where a portion of the radiation is converted to higher frequencies. From the HHG gas cell 432 emerges a beam of measurement radiation 442 including coherent radiation of the desired wavelength or wavelengths.

The measurement radiation 442 may contain multiple wavelengths. If the radiation is also monochromatic, then measurement calculations (reconstruction) may be simplified, but it is easier with HHG to produce radiation with several wavelengths. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials.

One or more filtering devices 444 may be provided. For example a filter such as a thin membrane of Aluminum (Al) may serve to cut the fundamental IR radiation from passing further into the inspection apparatus. A grating may be provided to select one or more specific harmonic wavelengths from among those generated in the gas cell 432. Some or all of the beam path may be contained within a vacuum environment, bearing in mind that EUV radiation is absorbed when traveling in air. The various components of radiation source 430 and illumination optics can be adjustable to implement different metrology 'recipes' within the same apparatus. For example different wavelengths and/or polarization can be made selectable.

From the radiation source 430, the filtered beam enters an inspection chamber where the substrate W including a structure of interest or target structure is held for inspection by substrate support 414. The target structure is labeled T. The atmosphere within inspection chamber is maintained near vacuum by vacuum pump 452, so that the soft X-ray radiation can pass without undue attenuation through the atmosphere. The illumination system includes one or more optical elements 454 for focusing the radiation into a focused beam 456, and may comprise for example a two-dimensionally curved mirror, or a series of one-dimensionally curved mirrors, as described in the prior applications mentioned above. Diffraction gratings such as the spectroscopic gratings can be combined with such mirrors, if desired. The focusing is performed to achieve a round or elliptical spot under 10 μm in diameter, when projected onto the structure of interest. Substrate support 414 comprises for example an X-Y translation stage and a rotation stage, by which any part of the substrate W can be brought to the focal point of beam to in a desired orientation. Thus the radiation spot S is formed on the structure of interest. The radiation scattered 408 from the structure of interest is then detected by detector 460.

Figure 5:
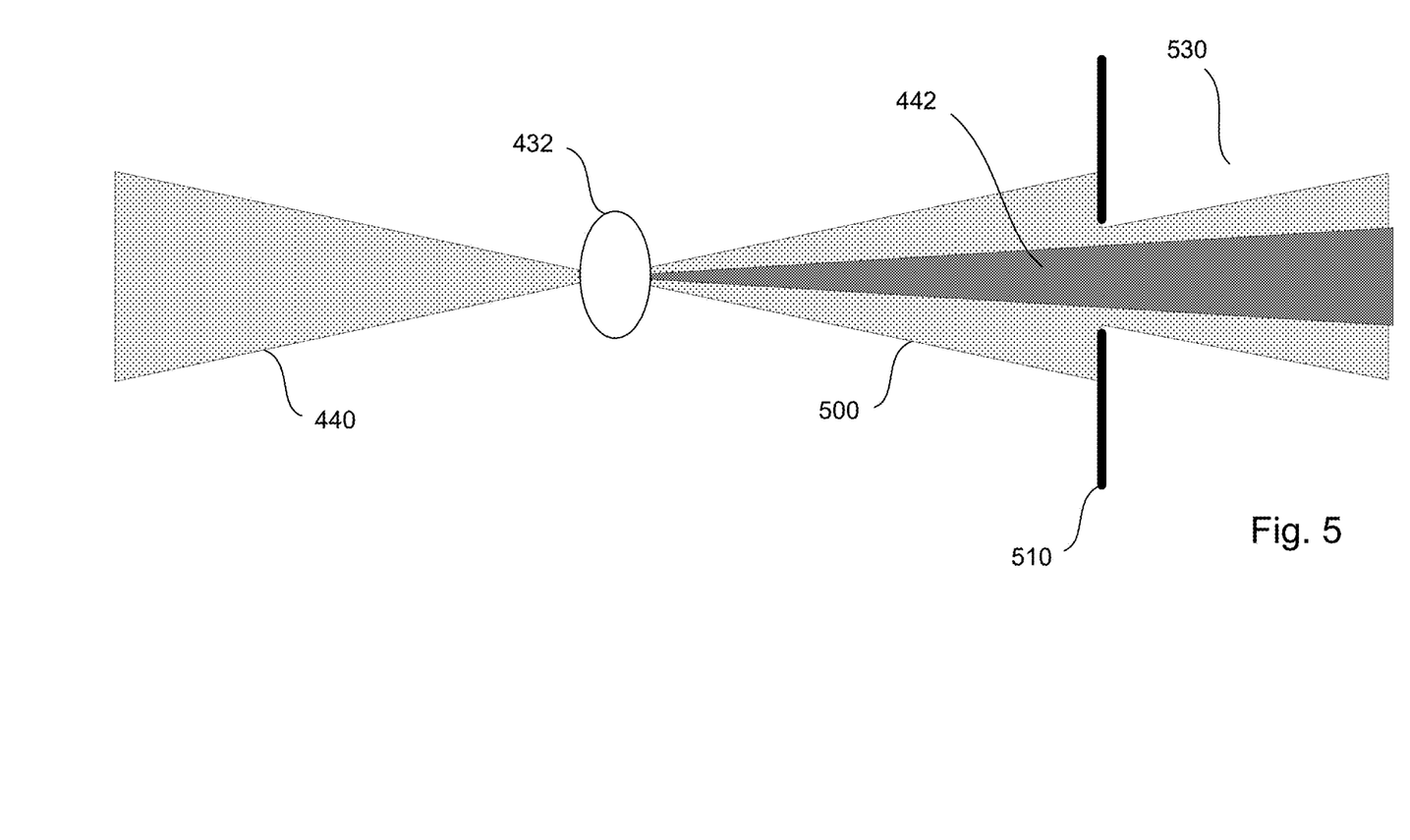
FIG. 5 shows schematically a detail of generated HHG radiation according to a known method illustrating the requirement for an infra-red filter element.

As mentioned above, the filtering element used to filter out unwanted IR radiation may comprise a thin membrane of, for example, aluminum. FIG. 5 shows schematically a detail of the generated HHG radiation illustrating the need for this filter. Shown is the incoming IR radiation 440, focused on HHG gas cell 432 (or other HHG generating medium). Shown beyond the HHG gas cell 432 is the generated HHG radiation 442 and the remaining IR radiation 500, which needs to be filtered out of the generated HHG radiation 442. As there is a region of overlap of the generated HHG radiation 442 and the remaining IR radiation 500, a filter which is largely transparent to the HHG radiation 442, but which blocks the IR radiation 500 is required. Ultra-thin metal film filters such as the aforementioned aluminum filter can be used at the drive laser powers used presently, although with some loss of HHG radiation. However, as the drive laser power increases, it becomes no longer possible to use such ultra-thin metal film filters. Therefore it is desirable to use a spatial filter 510, such as an aperture or pinhole. However, as can be seen, without spatially separated HHG radiation 442 and IR radiation 500, the filtered radiation 530 which passes through spatial filter 510 will comprise some IR radiation 500.

In near future, an increase of drive laser power is foreseen to meet the flux requirements of EUV/soft X-Ray radiation for CD and overlay applications. One way to scale the drive laser power, which is especially applicable for fiber lasers, is to coherently combine sub-beams from several separate amplifiers into a single beam. With coherent combination techniques, femtosecond lasers of 1 kW have been demonstrated, but no solutions for IR blocking have been proposed at such power levels.

It is known, for example from the publication "Coherent combination of ultrafast fiber amplifiers" by Marc Hanna et al, J. Phys. B: At. Mol. Opt. Phys. 49 (2016) 062004 (herein incorporated by reference), that coherent beam combining geometries can be classified in two broad categories, denoted as filled aperture and tiled aperture. It is the tiled aperture geometry which is most applicable to the concepts described herein. In the tiled aperture geometry, the sub-beams to be combined are simply positioned next to one another in the near field. Coherent combining is effective only in the far field, where a single spatial lobe is synthesized if the optical phase of the sub-beams is controlled. In this case, the combiner element can be either a simple lens or even just the diffraction over a certain distance. The spatial properties of the combined beam depend on the precise geometrical arrangement. In particular, the filling factor of the composite beam determines the fraction of power contained in the central combined lobe.

Figure 6:
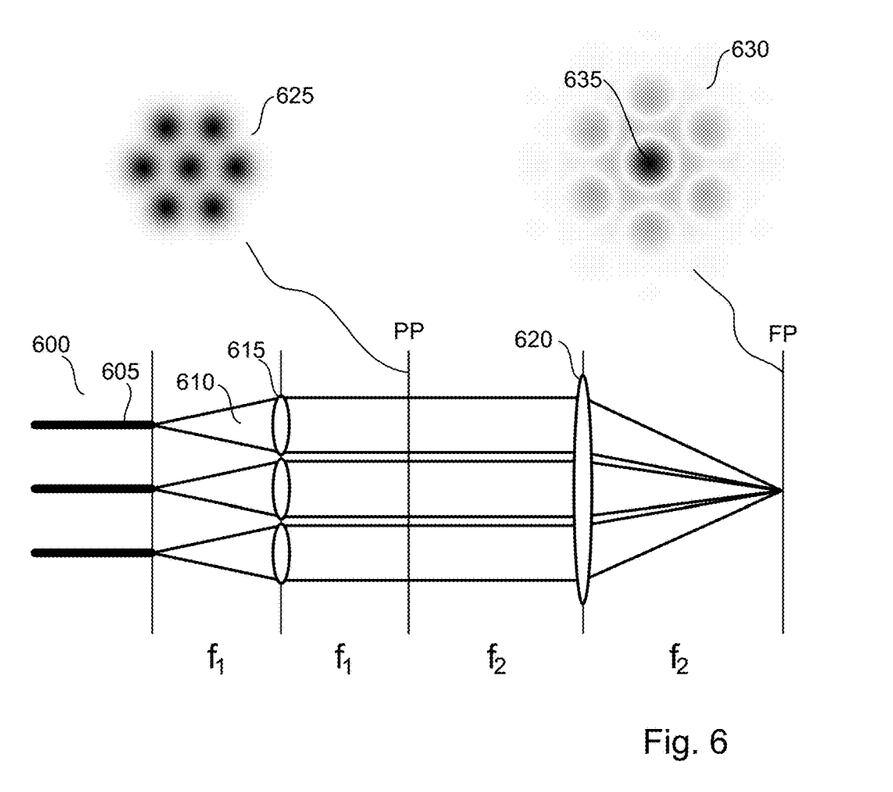
FIG. 6 schematically illustrates a known tiled-aperture coherent beam combining arrangement for generating laser pump radiation.

FIG. 6 schematically illustrates a tiled-aperture coherent beam combining arrangement for generating laser pump radiation suitable for pumping a HHG medium in a HHG source. It shows a fiber bundle 600 comprising a plurality of fibers 605, each fiber emitting a sub-beam of laser radiation 610. The sub-beams of laser radiation 610 may each be sourced from amplifiers which are mode-locked. A pupil plane PP is defined by a microlens array 615, and a lens 620 focuses the laser radiation at a focal plane FP. The focal length of the microlens array 615 is labelled $f_1$ and the focal length of the lens 620 is labelled $f_2$. Also shown in FIG. 6 is the pupil plane PP cross-section 625 showing an example tiling arrangement of 7 sub-beams of laser radiation 610 from 7 laser fibers 605. Such a hexagonal arrangement maximizes the fill factor at the pupil plane PP (near field). This maximizes the power within a central lobe at the focal plane FP. The focal plane FP cross-section 630 is also shown, from which the central lobe 635 and a number of side lobes 640 of lesser intensity can be seen (regions of greater intensity are shown darker). It should be noted that the actual number of fibers/sub-beams and the precise tiling arrangement is not important. What is relevant is that, typically, the fill factor at the pupil plane is maximized and that the tiling arrangement is evenly distributed within the aperture/pupil. For example, one or more sub-beams of laser radiation 610 may be in a central region of the pupil plane PP, and the remaining sub-beams of laser radiation 610 may be evenly distributed around the central region.

Figure 7:
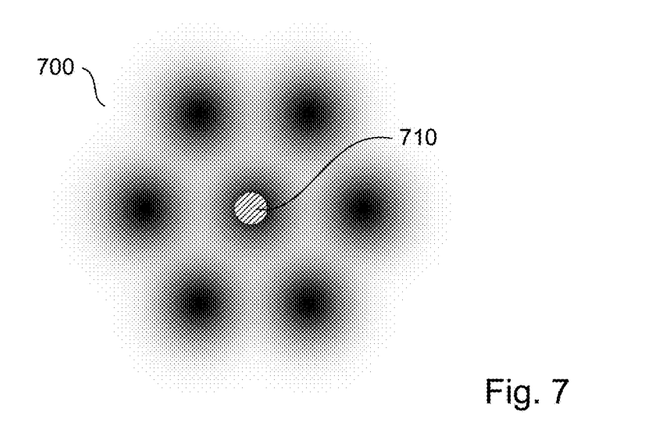
FIG. 7 shows the resultant radiation intensity profile at the far field, obtained from the arrangement illustrated in FIG. 6, and generated HHG profile.

FIG. 7 shows the resultant radiation cross section at the far field, obtained from the arrangement illustrated in FIG. 6. The IR (laser) radiation 700 has a similar intensity profile pattern as it did at the pupil plane PP (although the actual intensity values may differ). Also shown is the generated HHG radiation 710. While it is possible to filter out the IR outside of a central region by means of a blocking aperture (which only allows radiation within the central region through), it can be clearly seen that this will not filter out all of the IR radiation. The central region comprises a beam of the generated HHG radiation and a beam of IR radiation which are not separated spatially, thereby requiring the ultra-thin metal film filter to filter out the IR radiation as described.

It is therefore proposed to use a tiling geometry devoid of any sub-beams in a central region at the pupil plane (in the near field) to generate the HHG radiation. Such a tiling geometry may comprise an annular tiling geometry. The effect of such a geometry in the focal plane is small and, as with the previously described (maximally filled pupil) tiling geometry, only a single HHG radiation beam will be generated.

Figure 8A:
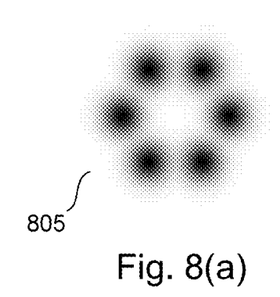
FIGS. 8(a)-8(c) show (a) a tiled-aperture coherent beam combining arrangement for generating laser pump radiation in accordance with an embodiment of the invention, (b) the resultant pupil plane intensity profile and (c) the resultant far field IR intensity profile and generated HHG profile.

FIG. 8 illustrates such an arrangement. FIG. 8(a) shows the tiling geometry 805 at the pupil plane in a particular example. It should be noted that the actual arrangement and the number of sub-beams being combined is variable and a matter of design choice. Of most relevance is that the central region of the tiling geometry has no laser sub-beams. In a preferred embodiment, the tiling geometry is such that the sub-beams being combined are evenly distributed at the periphery, around an empty central region.

Figure 8B:
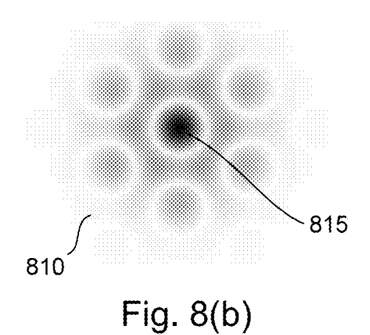

FIG. 8(b) shows the intensity distribution 810 at the focal plane. As can be seen, this intensity distribution is very similar to the intensity distribution 630 in the example of FIG. 6. By way of example, while a maximally filled tiling arrangement (such as the 7 sub-beam arrangement 625 of FIG. 6) maximizes the power of the central lobe 635 in focus, the power at the central lobe 815 using the equivalent 6 sub-beam annular tiling geometry 805 is only slightly lower, by comparison. Only the very high IR intensities (i.e., only the central lobe 815) at the focal plane contribute to the HHG process. The intensity-plus-phase at the focal plane determines the properties of the generated HHG beam. Since the focal plane intensity distributions are nearly identical for the two illustrated tiling geometries, the generated HHG beams will be also nearly identical.

Figure 8C:
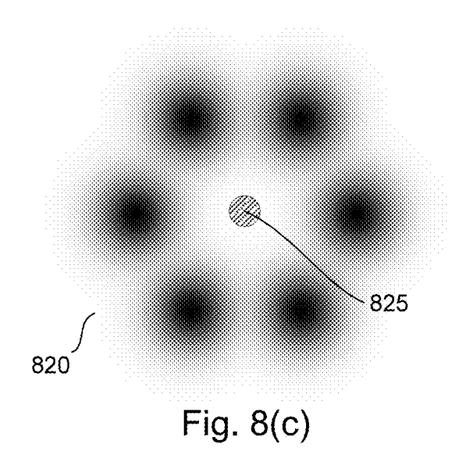

FIG. 8(c) shows the IR radiation intensity distribution 820 at the far field, and the location of the generated HHG radiation beam 825. As before, the IR radiation intensity distribution pattern at the far field is similar to the near field (pupil plane) intensity distribution pattern, and therefore corresponds to the tiling geometry 805. As such, the IR radiation has an annular profile with no IR radiation in the central region. Therefore, in the far field, the IR radiation is spatially separated from the generated HHG radiation beam 825. This means that the IR radiation can be blocked from entering the inspection apparatus by using a simple aperture filter or pinhole. The pinhole would enable all radiation (i.e., the HHG radiation) in the central region to pass through its aperture unobstructed, while blocking all radiation (i.e., IR pump radiation) outside of this central region.

Figure 9:
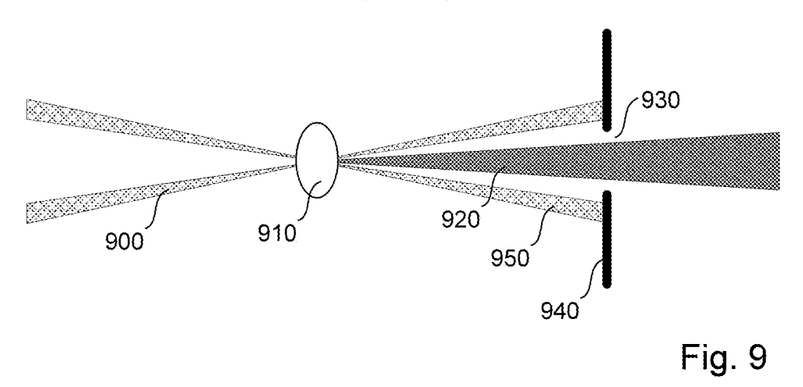
FIG. 9 schematically illustrates a filter arrangement according to an embodiment of the invention.

FIG. 9 schematically illustrates a filter arrangement according to an embodiment. It shows the annular IR radiation 900 (from the pump laser) exciting the HHG generation medium/gas cell 910. The generated HHG radiation beam 920 passes through the aperture 930 of spatial filter 940. The IR radiation 950 in the far field has an annular profile, and is blocked by the spatial filter 940. The aperture 930 is sized to pass (substantially) only the generated HHG radiation beam 920 and to block the IR radiation 950. The combination of a tiling geometry as illustrated in FIG. 8(a) (or any other annular geometry) and aperture filter arrangement illustrated here can be used in the inspection arrangement of FIG. 3 or FIG. 4. In the example of FIG. 4, the arrangement would be generally the same as that illustrated except the pump laser 431 is configured to generate a pump radiation beam 440 having a profile comprising no pump radiation in a central region of the beam (e.g., as illustrated in FIG. 8(a)); and the spatial filter 940 (or similar spatial filter) would replace the ultra-thin metallic film filter 444. As such, the pump laser 431 may have multiple sub-beams in a tiling arrangement which has no sub-beams in a central region of the tiling arrangement.

It should be noted that the propagation of the HHG radiation beam depends on the instantaneous, local propagation direction (i.e., phase front) of the pump laser beam in the focal plane. When multiple pump laser sub-beams are combined into a single focus, they will interfere and the electric field formed by the combination of the beams will have a certain phase front which determines where the HHG radiation beam will go. If the drive field is asymmetric, the HHG beam will also be asymmetric. The HHG conversion process conserves momentum, i.e., the Nth harmonic of the HHG radiation carries the momentum of N IR photons. These photons do not have to come from the same beam (because at the focus, there are no longer multiple beams, it is only the electric field that matters). As a result, the HHG radiation cannot diverge more the IR beams.

Another consequence of this is, should multiple pump laser sub-beams be focused at the same spot but at different angles, the HHG radiation will also be spread out between the sub-beams. This is not very convenient if photons are to be used. Therefore it is preferable that the multiple sub-beams are close together, (e.g. the distance between sub-beams in the tiling geometry is minimized).

When multiple sub-beams are used, the phase of each beam has an influence on the total electric field at the focus. In the case of two-color HHG (i.e., two drive laser sub-beams with different colors) this is actively used to tune phase matching. For coherent combination, it may be preferable to keep the sub-beams in-phase as much as possible, to maximize the intensity in the central lobe in focus (part of the difficulty in coherent combination is to maintain the phase of all the sub-beams synchronized). However, in an alternative embodiment, it might be beneficial to alter the relative phases (e.g., by a small amount) to optimize phase matching.

Further embodiments are disclosed in the subsequent numbered clauses:

1. An illumination source apparatus, comprising:
  a high harmonic generation medium;
  a pump radiation source operable to emit a beam of pump radiation having a profile comprising no pump radiation in a central region of the beam, for exciting the high harmonic generation medium so as to generate high harmonic radiation; and
  a spatial filter located beyond a focal plane of said beam of pump radiation, operable to block said pump radiation;
  wherein said pump radiation and the generated high harmonic radiation are spatially separated beyond the focal plane of said beam of pump radiation.

2. An illumination source apparatus as defined in claim 1, wherein said beam of pump radiation has a substantially symmetrical profile.

3. An illumination source apparatus as defined in claim 2, wherein said beam of pump radiation has a substantially annular profile.

4. An illumination source apparatus as defined in any preceding claim, wherein the spatial filter is located in the far field of the beam of pump radiation.

5. An illumination source apparatus as defined in claim 4, wherein the beam of pump radiation in the far field has a similar profile as in a near field of the beam of pump radiation.

6. An illumination source apparatus as claimed claim 4 or 5, operable such that the spatial separation of said pump radiation and the generated high harmonic radiation results in the generated high harmonic radiation being comprised within said central region of said pump radiation profile in said far field.

7. An illumination source apparatus as defined in any preceding claim, wherein said spatial filter comprises an aperture sized to block radiation outside of said central region of said pump radiation profile.

8. An illumination source apparatus as defined in any preceding claim, wherein pump radiation source comprises a plurality of sub-beam sources operable to provide a plurality of coherently combined sub-beams of pump radiation.

9. An illumination source apparatus as defined in claim 8, wherein said plurality of sub-beam sources are sourced from a plurality of mode-locked amplifiers.

10. An illumination source apparatus as defined in claim 8 or 9, wherein said plurality of sub-beam sources are arranged in a tiled aperture geometry, and wherein a central region of the tiled aperture geometry is devoid of said sub-beams.

11. An illumination source apparatus as defined in claim 10 wherein said tiled aperture geometry comprises said sub-beams evenly distributed around said central region.

12. An illumination source apparatus as defined in claim 10 or 11, wherein the tiled aperture geometry is comprised within a pupil plane defined by an optical system comprising a microlens array having a microlens for each sub-beam and a lens focusing said sub-beams at said focal plane.

13. An illumination source apparatus as defined in any of claims 8 to 12, comprising between 3 and 10 of said sub-beam sources.

14. An illumination source apparatus as defined in any of claims 8 to 12, comprising between 5 and 8 of said sub-beam sources.

15. An illumination source apparatus as defined in any of claims 8 to 14, wherein distances between the sub-beam sources is minimized.

16. An inspection apparatus for measuring a target structure on a substrate, comprising:
  an illumination source as defined in any preceding claim for generating measurement radiation, said measurement radiation comprising said high harmonic radiation.

17. A method of generating high harmonic measurement radiation optimized for filtration of pump radiation therefrom, a beam of said pump radiation being used to generate the high harmonic measurement radiation, wherein said high harmonic measurement radiation and said pump radiation is separated spatially beyond a focal plane of said beam of pump radiation; said method comprising:
  coherently combining a plurality of sub-beams of pump radiation using a tiled aperture geometry wherein a central region of the tiled aperture geometry is devoid of said sub-beams.

18. A method as defined in claim 17, comprising spatially filtering said high harmonic measurement radiation using an aperture sized to only allow said high harmonic measurement radiation through the aperture.

19. A method as defined in claim 18, wherein said spatial filtering is performed in a far-field of said beam of pump radiation.

20. A method as defined in claim 18 or 19, wherein the spatial separation of said pump radiation and the generated high harmonic radiation is such that the said generated high harmonic radiation is comprised within a central region of the pump radiation profile;
and said aperture is sized to block radiation outside of said central region of said pump radiation profile.

21. A method as defined in any of claims 17 to 20, wherein said tiled aperture geometry comprises said sub-beams evenly distributed around said central region of the tiled aperture geometry.

22. A method as defined in any of claims 17 to 21, wherein the tiled aperture geometry is comprised within a pupil plane defined by an optical system comprising a microlens array having a microlens for each sub-beam and a lens focusing said sub-beams at said focal plane.

23. A method as defined in any of claims 17 to 22, comprising between 3 and 10 of said sub-beams.

24. A method as defined in any of claims 17 to 22, comprising between 5 and 8 of said sub-beams.

25. A method as defined in any of claims 17 to 24, wherein distances between the sub-beams is minimized.

26. An inspection method for measuring a parameter relating to a structure formed by a lithographic process, comprising:
performing the method of any of claims 17 to 25, to generate high harmonic measurement radiation; and
measuring said structure using said high harmonic measurement radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An illumination source apparatus, comprising:
a high harmonic generation medium;
a pump radiation source configured to emit a beam of pump radiation having a profile comprising no pump radiation in a central region of the beam, the beam of pump radiation configured to excite the high harmonic generation medium so as to generate high harmonic radiation; and
a spatial filter located beyond a focal plane of the beam of pump radiation and configured to block the beam of pump radiation;
wherein the beam of pump radiation and the generated high harmonic radiation are spatially separated beyond the focal plane of the beam of pump radiation, and
wherein the pump radiation source comprises a plurality of sub-beam sources.

2. The illumination source apparatus of claim 1, wherein the beam of pump radiation has a substantially symmetrical profile.

3. The illumination source apparatus of claim 1, wherein the beam of pump radiation has a substantially annular profile.

4. The illumination source apparatus of claim 1, wherein the spatial filter is located in a far field of the beam of pump radiation.

5. The illumination source apparatus of claim 4, wherein the beam of pump radiation in the far field has a similar profile as in a near field of the beam of pump radiation.

6. The illumination source apparatus of claim 4, wherein the spatial separation of the beam of pump radiation and the generated high harmonic radiation results in the generated high harmonic radiation being comprised within the central region of the pump radiation profile in the far field.

7. The illumination source apparatus of claim 1, wherein the spatial filter comprises an aperture sized to block radiation outside of the central region of the pump radiation profile.

8. The illumination source apparatus of claim 1, wherein the plurality of sub-beam sources are configured to provide a plurality of coherently combined sub-beams of pump radiation.

9. The illumination source apparatus of claim 1, wherein the plurality of sub-beam sources are sourced from a plurality of mode-locked amplifiers.

10. The illumination source apparatus of claim 1, wherein:
the plurality of sub-beam sources are arranged in a tiled aperture geometry, and
a central region of the tiled aperture geometry is devoid of the sub-beams.

11. The illumination source apparatus of claim 10, wherein the tiled aperture geometry comprises the sub-beams evenly distributed around the central region.

12. The illumination source apparatus of claim 10, wherein the tiled aperture geometry is comprised within a pupil plane defined by an optical system comprising a microlens array having a microlens for each sub-beam and a lens focusing the sub-beams at the focal plane.

13. The illumination source apparatus of claim 1, wherein the pump radiation source comprises between 3 and 10 of the sub-beam sources.

14. The illumination source apparatus of claim 1, wherein the pump radiation source comprises between 5 and 8 of the sub-beam sources.

15. The illumination source apparatus of claim 1, wherein distances between the sub-beam sources is minimized.

16. An inspection apparatus for measuring a target structure on a substrate, comprising:
an illumination source comprising:
a high harmonic generation medium;
a pump radiation source configured to emit a beam of pump radiation having a profile comprising no pump radiation in a central region of the beam, the beam of pump radiation configured to excite the high harmonic generation medium so as to generate high harmonic radiation;
a spatial filter located beyond a focal plane of the beam of pump radiation, configured to block the beam of pump radiation,
wherein the beam of pump radiation and the generated high harmonic radiation are spatially separated beyond the focal plane of the beam of pump radiation,
wherein the high harmonic radiation is configured to be used as measurement radiation, and
wherein the pump radiation source comprises a plurality of sub-beam sources.

17. A method of generating high harmonic measurement radiation optimized for filtration of pump radiation therefrom, the method comprising:
generating the high harmonic measurement radiation using a beam of the pump radiation, wherein the high harmonic measurement radiation and the beam of pump radiation are separated spatially beyond a focal plane of the beam of pump radiation; and
coherently combining a plurality of sub-beams of pump radiation using a tiled aperture geometry,
wherein a central region of the tiled aperture geometry is devoid of the sub-beams.

18. The method of claim 17, further comprising: spatially filtering the high harmonic measurement radiation using an aperture sized to only allow the high harmonic measurement radiation through the aperture.

19. The method of claim 18, wherein the spatial filtering is performed in a far-field of the beam of pump radiation.

20. A method for measuring a parameter relating to a structure formed by a lithographic process, comprising:
generating high harmonic measurement radiation optimized for filtration of pump radiation using a beam of the pump radiation, wherein the high harmonic measurement radiation and the pump radiation are separated spatially beyond a focal plane of the beam of pump radiation;
coherently combining a plurality of sub-beams of pump radiation using a tiled aperture geometry, wherein a central region of the tiled aperture geometry is devoid of the sub-beams, the coherently combining being used to generate high harmonic measurement radiation; and
measuring the structure using the high harmonic measurement radiation.

* * * * *